United States Patent

[11] 3,623,146

[72] Inventors Yoichi Kaneko
Kokubunji-shi;
Kenzi Sekine, Hachioji-shi, both of Japan
[21] Appl. No. 827,275
[22] Filed May 23, 1969
[45] Patented Nov. 23, 1971
[73] Assignee Hitachi, Ltd.
Tokyo, Japan
[32] Priorities May 29, 1968
[33] Japan
[31] 43/36069;
July 17, 1968, Japan, No. 43/50300

[54] TEMPERATURE COMPENSATED CAVITY FOR A SOLID-STATE OSCILLATOR
1 Claim, 6 Drawing Figs.

[52] U.S. Cl. .......... 331/96, 331/107 G, 331/176, 333/83 T
[51] Int. Cl. .......... H03b 3/04, H03b 7/14

[50] Field of Search .......... 331/96–98, 107 G, 107 T, 109, 176, 101, 102; 333/82 BT, 83 T

[56] References Cited

UNITED STATES PATENTS

| | | | |
|---|---|---|---|
| 2,716,222 | 8/1955 | Smullin | 333/82 T |
| 2,790,151 | 4/1957 | Riblet | 333/82 T |
| 3,160,825 | 12/1964 | Derr | 333/83 T |
| 3,487,334 | 12/1969 | Eastman et al. | 331/107 G |
| 3,509,567 | 4/1970 | Bulman | 331/107 G |

*Primary Examiner*—Roy Lake
*Assistant Examiner*—Siegfried H. Grimm
*Attorney*—Craig, Antonelli & Hill

ABSTRACT: A temperature-compensating device for a solid-state oscillator, wherein a part of the conductive walls constituting a cavity resonator is formed by a movable plate, the movable plate is fixed to one end of a dielectric rod with a high coefficient of linear expansion, and the other end of said rod is fixed to an extension of said cavity resonator.

INVENTORS

YOICHI KANEKO and KENJI SEKINE

BY
Craig, Antonelli, Stewart & Hill
ATTORNEY

INVENTORS
YOICHI KANEKO and KENJI SEKINE

BY Craig, Antonelli, Stewart & Hill
ATTORNEY

TEMPERATURE COMPENSATED CAVITY FOR A SOLID-STATE OSCILLATOR

This invention relates to a temperature-compensating device for a solid-state oscillator, and more particularly it pertains to such a device adapted for stabilizing the oscillation frequency of a solid-state oscillator which tends to be greatly changed by temperature variation.

A conventional solid-state oscillator, such as for example one using a Gunn diode, is adapted to oscillate at an oscillation frequency which depends upon the dimensions of the Gunn diode, the magnitude of the bias voltage applied thereto and so forth. In such a conventional solid-state oscillator, however, there is a tendency for the oscillation frequency to change with variations in ambient temperature, temperature rise occurring during the use of the oscillator and so forth. The causes for such oscillation frequency variations are thermal deformation of the cavity resonator and variations in the temperature characteristics of the Gunn diode. Frequency variations due to the latter cause are much more remarkable than those due to the former cause. For example, in the case of a 13 GHz. solid-state oscillator using a Gunn diode, the frequency change due to thermal deformation of the resonator per se is as small as about 0.21 MHz./° C., whereas frequency change due to a change in the temperature characteristics of the Gunn diode is as great as about 1 MHz./° C. Frequency change of a solid-state oscillator is in substantially linear relationship with temperature change, and a major portion thereof is caused due to variations in the temperature characteristics of the Gunn diode.

In electron tubes such as Klystrons and the like, the conventional method of compensating for a frequency change due to a temperature change is to compensate for the frequency change due to thermal deformation of the cavity by making use of thermal expansion of metal, as is well known in the art. This method is effective in compensating for a small frequency change due to thermal deformation of the cavity for example, but is is not effective for a solid state oscillator wherein a wide range of frequency change tends to occur. In the cases where the frequency change is about ±1 percent or less of the oscillation frequency, the compensation of the frequency change can also be achieved by an AFC system for controlling the oscillation frequency by detecting the frequency deviation. In an attempt to compensate for a frequency change ranging more widely than the above range, however, a very complex AFC mechanism is required, which obviously constitutes a great disadvantage.

It is a primary object of the present invention to provide a temperature-compensating device for a solid-state oscillator which is adapted to maintain the oscillation frequency substantially constant irrespective of temperature variations.

Another object of the present invention is to provide a temperature compensating device for a solid-state oscillator which is adapted to make possible the production of an oscillation output which remains substantially constant irrespective of temperature variations.

A further object of the present invention is to provide a temperature-compensating device for a solid-state oscillator which can be greatly miniaturized.

A still further object of the present invention is to provide a temperature-compensating device wherein less high-frequency loss is caused.

The foregoing objects are accomplished in a temperature compensating device for a solid-state oscillator, comprising a cavity resonator including a movable wall, an oscillating element inserted in said cavity resonator, means for applying a bias voltage to said oscillating element, a dielectric rod with a high coefficient of linear expansion, and an output portion, said movable wall being fixed to one end of said dielectric rod, the other end of the rod being fixed to an extension of said cavity resonator.

Other objects, features and advantages of the present invention will become apparent from the following description taken in conjunction with the accompanying drawings, in which.

Figure 1:
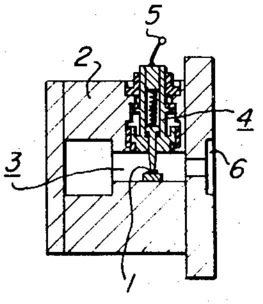
FIG. 1 PRIOR ART
FIG. 1 is a sectional view showing the construction of an example of the conventional solid-state oscillator.

Referring first to FIG. 1, numeral 1 represents a Gunn diode (generally, negative resistance oscillating element), 2 a cavity resonator, 3 a cavity portion, 4 a high-frequency choke, 5 a DC bias terminal, and 6 an output window.

In such arrangement, a DC bias voltage is applied from the DC bias terminal 5 to the Gunn diode 1 through the high-frequency choke 4 so that the oscillator is enabled to oscillate at an oscillation frequency which depends upon the dimensions of the Gunn diode 1 and magnitude of the bias voltage, and the oscillation output is taken from the oscillation output window 6. The high-frequency choke 4 is provided for the purpose of preventing leakage of high-frequency energy occurring in the cavity 3 and permitting the application of the DC bias voltage to the Gunn diode 1. Frequency adjusting means and a stub for matching the oscillator to a load are omitted.

The aforementioned solid-state oscillator is adapted to oscillate at a predetermined oscillation frequency which depends upon the dimensions of the Gunn diode and magnitude of the bias voltage as described above, but there is a tendency that the oscillation frequency is changed due to a change in ambient temperature, temperature rise occurring during the use of the oscillator and so forth.

Figure 2:
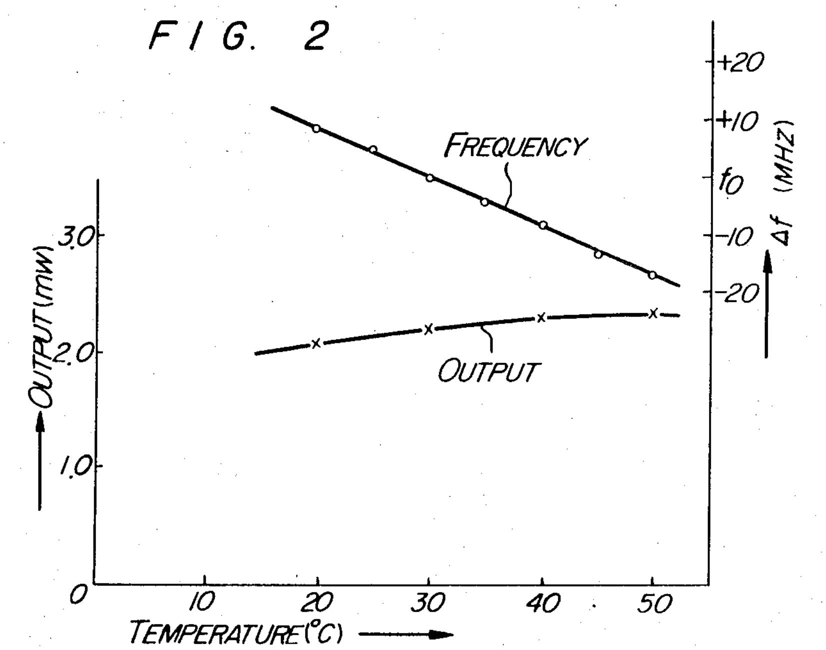
FIG. 2 is a graph showing the temperature characteristics of a 13 GHz. solid-state oscillator.

FIG. 2 shows the tendency of such oscillation frequency variation, from which it will be seen that the oscillation frequency varies substantially linearly with temperature variation. A major portion of the frequency change is caused due to a variation in the temperature characteristics of the Gunn diode.

In accordance with the present invention, variations in the frequency and output with temperature variation are compensated for through the use of a dielectric rod having a high coefficient of linear expansion.

The present invention will be described in detail below.

Figure 3:
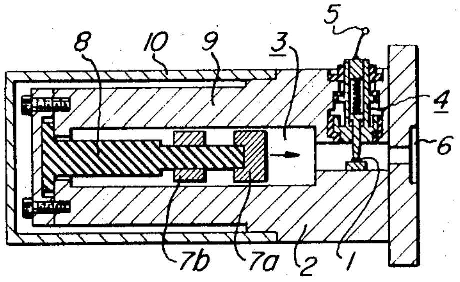
FIG. 3 is a sectional view of an embodiment of the present invention.

Referring now to FIG. 3, numeral 1 represents a Gunn diode, 2 a cavity resonator, 3 a cavity portion, 4 a high-frequency choke, 5 a DC bias applying terminal, and 6 an oscillation output window. The solid-state oscillator constituted by these elements is quite similar to the conventional one, and therefore detailed description thereof will be omitted. In accordance with the present invention, there is provided a movable conductive wall 7*a* which is fixed to one end of a dielectric rod 8 having a high coefficient of linear expansion, the other end of the dielectric rod 8 being fixed to an extension 9 of the cavity resonator 2. This movable conductive wall 7*a* can be moved along the extension 9, and the oscillation frequency of the oscillator is adjusted through the movement of the movable conductive wall 7*a*. Further, a conductive plate 7*b* is mounted on the dielectric rod 8 at a position spaced apart from the conductive wall 7*a* by a distance corresponding to about ¼$\lambda$($\lambda$: the wavelength of the oscillation wave). It is to be noted that the conductive wall 7 *a* and conductive plate 7*b* constitute a high-frequency choke for preventing leakage of high-frequency energy. Numeral 10 denotes a casing formed by a metal such for example as copper which is adapted to isolate the interior from the surrounding atmosphere and to maintain the dielectric rod 8 at a uniform temperature.

Figure 4:
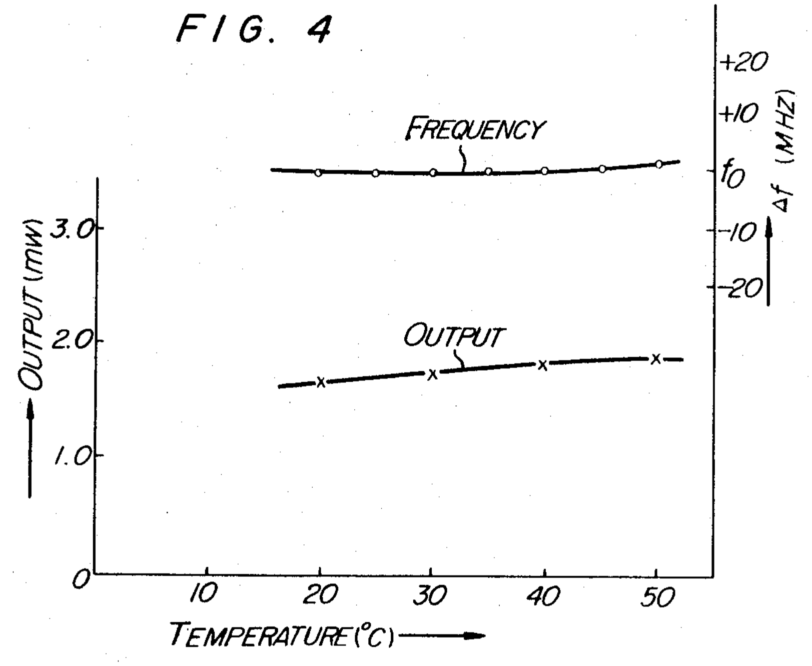
FIG. 4 is a graph showing the temperature characteristics of a solid-state oscillator in which the present invention is applied.

Description will now be made of the operation of the foregoing arrangement. Assume now that the oscillation frequency of the Gunn diode is decreased due to temperature rise for example as shown in FIG. 2. Then, the dielectric rod 8 is axially expanded with the temperature rise, so that the conductive wall 7*a* is moved in such a direction as indicated by the arrow in the Figure. Therefore, the inductance and capacitance of the resonator 2 are decreased, so that the resonant frequency increases. Thus, there is provided a very effective temperature compensating device which is so designed that the frequency change due to the temperature change in the Gunn diode is cancelled out by the movement of the conductive wall 7*a* which is effected by suitably adjusting the effective length of the dielectric rod 8. For example, by using a Teflon member (coefficient of linear expansion: $1.0\times10^{'7E'4}$/° C.) having a length of about 3 cm. as the dielectric rod 8 in a 13 GHz. solid-state oscillator using a Gunn diode, there were obtained a frequency and output which are substantially constant irrespective of temperature variations as shown by characteristic curves of FIG. 4. The cavity resonator 2 is formed of copper and the extension 9 thereof is made of a material having a high heat conductivity such as copper to thereby enable a temperature change which has effect on the Gunn diode to be quickly transmitted to the dielectric rod 8.

Although in the foregoing embodiment the dielectric rod 8 was formed of Teflon, an effect similar to that obtained by the use of Teflon can be attained by using a rod formed of a dielectric material with a high coefficient of linear expansion such as Ebonite, Derlin, Nylon-66 or the like. The length of the dielectric rod 8 to be used is suitably determined depending upon the kind of the dielectric and temperature characteristics of the negative resistance oscillating element.

By using in combination a rod formed of a metal having a relatively high coefficient of linear expansion such as copper, aluminum or the like instead of the Teflon rod and a cavity resonator made of a metal having a relatively low coefficient of linear expansion such as Invar, it is also possible to effect temperature compensation. However, the use of a rod formed of copper (coefficient of linear expansion: $16.6\times10^{'7E'6}$/° C.) and a cavity resonator formed of Invar (coefficient of linear expansion: $0.9\times10^{'7E'6}$/° C.) requires a length of copper rod as long as about 30 cm. for temperature compensation. Obviously, this constitutes a great obstacle to the miniaturization of the oscillator. Furthermore, it is required that a small gap be defined between the conductive wall 7*a* and conductive plate 7*b* and the wall portion of the cavity 3 in order that the oscillator may operate stably. However, much difficulty is encountered in an attempt to fix such a long rodlike member at its one end with the conductive wall 7*a* without having the plate 7*b* contact the wall portion of the cavity 3. In contrast, according to the present invention, the length of the rod can be reduced by forming the same of a dielectric material having a high coefficient of linear expansion. This constitutes a great advantage also from the standpoint of manufacturing techniques.

Figure 5:
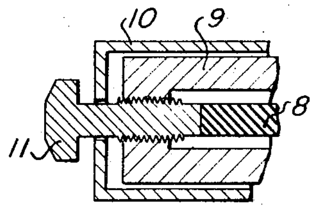
FIG. 5 is a sectional view of another embodiment of the present invention.

In the foregoing, temperature compensation was effected only with respect to a particular frequency by such an arrangement that the conductive wall 7*a* is fixed to one end of the rodlike dielectric member 8 of which the other end is fixed to the extension 9 of the cavity resonator 2. However, it is also possible to change the oscillation frequency as desired and yet achieve temperature compensation with respect to any desired oscillation frequency by such an arrangement as shown in FIG. 5 wherein the dielectric member 8 is fixed to a movable screw 11 (this has a construction similar to that of a micrometer for example), and the position of the movable conductive wall 7*a* can be freely adjusted by means of the movable screw 11.

In another embodiment, the conductive plate 7*b* adapted to auxiliarily increase the high frequencywise shorting effect may be omitted. The conductive wall 7*a* may be configured in any desired shape so long as the high frequencywise shorting effect can be sufficiently produced thereby.

In a solid-state oscillator provided with the present temperature compensating device, the high-frequency output thereof tends to be decreased due to leakage of high-frequency energy stemming from the presence of the high-frequency choke. Therefore, it is required that the high-frequency choke have a shape which will minimize high-frequency loss and yet allow miniaturization.

In order to prevent such high-frequency leakage, use is often made of a high-frequency choke constituted by two metal rings each having a width corresponding to ¼λ, with a gap corresponding to ¼λ being maintained therebetween. However, the use of such a high-frequency choke results in about 20 percent of the resulting high-frequency energy being wasted as a high-frequency loss due to leakage. In addition, it is impossible to make the length of the high-frequency choke shorter than ¾λ. By using an increased number of metal rings, leakage can be decreased, but in that case, the high-frequency choke should be made longer, and therefore it inevitably becomes large sized. If a single metal ring is used, then about 30 percent of the resulting high-frequency energy is wasted as high-frequency loss.

Description will now be made of an embodiment adapted to minimize high-frequency loss.

Description will now be made of an embodiment adapted to minimize high-frequency loss.

Figure 6:
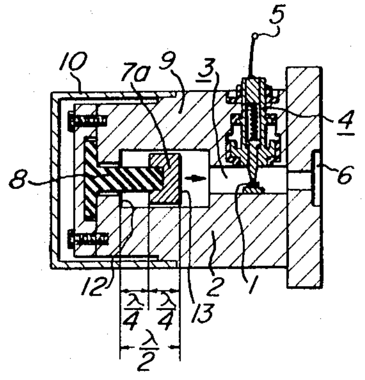
FIG. 6 is a sectional view of a third embodiment of the present invention.

Such embodiment is shown in FIG. 6, wherein parts corresponding to FIG. 3 are indicated by like numerals. Numeral 13 represents the cavity resonator 3 side surface of the movable conductive wall 7*a* and 12 the cavity end surface surrounded by the extension 9 of the cavity resonator 3. In the foregoing arrangement, the thickness of the conductive wall 7*a* is selected to correspond to ¼λ(λ:the wavelength of the oscillation wave), and the surface 13 of the conductive wall 7*a* and the cavity end surface 12 are spaced apart from each other by a distance corresponding to ½λ.

The temperature compensating operation of the arrangement just described above is quite similar to those of the previously described embodiments, and therefore description thereof will be omitted. By using the high-frequency choke having the aforementioned construction, the amount of high-frequency loss can be reduced down to about 10 percent of the high-frequency energy occurring in the cavity, so that the energy can be efficiently taken out. Furthermore, the oscillator can be effectively miniaturized since the length of the high-frequency choke can be made as short as ½λ. The distance between the end surface 13 of the conductive wall 7*a* and the end surface 12 of the cavity is varied due to thermal expansion of the dielectric member, but the amount of variation is very small as compared with ¼λ and it has therefore only a small effect on high-frequency loss.

Ad described above, in accordance with the present invention, it is possible to very effectively compensate for great frequency variations tending to be caused due to variations in the temperature characteristics of a negative resistance oscillating element. Furthermore, a temperature compensating device with low loss using a high-frequency choke constituted by a single metal ring is provided whereby the solid-state oscillator can be greatly miniaturized.

What is claimed is:

1. A temperature-compensating device for a solid-state oscillator, comprising a cavity resonator provided with a movable conductive plate, a solid-state oscillating element inserted in said cavity resonator, means for applying a bias voltage to said oscillating element, a rodlike dielectric member, and an output portion, said movable conductive plate being fixed to one end of said rodlike dielectric member, the other end of said rodlike dielectric member being supported by an extension of said cavity resonator, wherein the thickness of said movable conductive plate is selected to be ¼λ(λ being the wavelength of the oscillation wave), and the surface of said movable conductive plate which faces said cavity resonator is spaced apart from the portion of said extension which supports said rodlike dielectric member by a distance corresponding to ½λ.

* * * * *

10105870 0789